(12) United States Patent
Lax (10) Patent No.: US 11,710,396 B2
(45) Date of Patent: Jul. 25, 2023

(54) FIXTURES WITH SIGNALING DEVICES (71) Applicant: Autronic Plastics, Inc., Central Islip, NY (US)

(72) Inventor: Daniel A. Lax, Roslyn, NY (US)

(73) Assignee: Autronic Plastics, Inc., Central Islip, NY (US)

(\*) Notice: Subject to any disclaimer, the term of this patent is extended or adjusted under 35 U.S.C. 154(b) by 0 days.

(21) Appl. No.: 17/119,872

(22) Filed: Dec. 11, 2020

(65) Prior Publication Data

US 2021/0201656 A1 Jul. 1, 2021

Related U.S. Application Data (63) Continuation-in-part of application No. 16/532,004, filed on Aug. 5, 2019, now abandoned, which is a continuation of application No. 15/805,101, filed on Nov. 6, 2017, now abandoned.

(60) Provisional application No. 62/946,764, filed on Dec. 11, 2019, provisional application No. 62/417,961, filed on Nov. 4, 2016.

(51) Int. Cl.
| | | |
|---|---|---|
| *G08B 25/14* | (2006.01) | |
| *F21S 9/02* | (2006.01) | |
| *F21V 21/40* | (2006.01) | |
| *F21V 23/02* | (2006.01) | |
| *F21V 3/00* | (2015.01) | |
| *G08B 5/36* | (2006.01) | |
| *F21V 11/00* | (2015.01) | |
| *G01R 31/385* | (2019.01) | |
| *F21V 33/00* | (2006.01) | |
| *F21V 15/01* | (2006.01) | |
| *F21Y 103/10* | (2016.01) | |
| *F21Y 115/10* | (2016.01) | |
| *G08B 21/12* | (2006.01) | |

(52) U.S. Cl.
CPC .............. *G08B 25/14* (2013.01); *F21S 9/022* (2013.01); *F21V 3/00* (2013.01); *F21V 11/00* (2013.01); *F21V 21/40* (2013.01); *F21V 23/023* (2013.01); *F21V 33/0076* (2013.01); *G01R 31/385* (2019.01); *G08B 5/36* (2013.01); *F21V 15/01* (2013.01); *F21Y 2103/10* (2016.08); *F21Y 2115/10* (2016.08); *G08B 21/12* (2013.01)

(58) Field of Classification Search
CPC .................................. H02J 9/02; Y02B 20/42
See application file for complete search history.

(56) References Cited

U.S. PATENT DOCUMENTS

| | | | | |
|---|---|---|---|---|
| 5,519,380 A | \* | 5/1996 | Edwards | ................ G08B 21/22 340/8.1 |
| 2002/0027510 A1 | \* | 3/2002 | Jones | ..................... G08G 1/095 340/693.2 |
| 2008/0265799 A1 | \* | 10/2008 | Sibert | .................. H05B 47/155 315/292 |
| 2011/0133655 A1 | \* | 6/2011 | Recker | ..................... H02H 3/08 315/159 |

(Continued)

*Primary Examiner* — Fabricio R Murillo Garcia
(74) *Attorney, Agent, or Firm* — Fred Zollinger (57) ABSTRACT

A light fixture for a public transportation train system powers an antenna used for train signaling. The antenna can provide to the train a location marker associated with the location of the antenna. The antenna can provide to the train other data communicated to the light fixture through the light fixture communication system.

13 Claims, 4 Drawing Sheets

(56) References Cited

U.S. PATENT DOCUMENTS

| | | | | |
|---|---|---|---|---|
| 2014/0104067 A1* | 4/2014 | Chien | .................... | G08B 17/10 |
| | | | | 340/628 |
| 2014/0320011 A1* | 10/2014 | Hegarty | ................. | H05B 45/50 |
| | | | | 315/132 |
| 2016/0226207 A1* | 8/2016 | Fullerton | ........... | H01R 13/6675 |
| 2016/0323981 A1* | 11/2016 | Clark | .................... | H05B 45/10 |
| 2020/0317241 A1* | 10/2020 | Carlson | ................. | B61L 25/025 |

* cited by examiner

FIXTURES WITH SIGNALING DEVICES

CROSS REFERENCE TO RELATED APPLICATIONS

This application is a continuation-in-part application claiming priority to U.S. application Ser. No. 16/532,004 filed Aug. 5, 2019, which is a continuation application claiming priority to U.S. application Ser. No. 15/805,101 filed Nov. 6, 2017, which claims the benefit of U.S. Provisional Application 62/417,961 filed Nov. 4, 2016. This application also claims the benefit of U.S. Provisional Application 62/946,764 filed Dec. 11, 2019. The disclosures of each are incorporated herein by reference.

BACKGROUND OF THE DISCLOSURE

1. Technical Field

The present disclosure relates to powered signaling devices for use in public transportation facilities. More particularly, the disclosure relates to fixtures that provide normal and battery backup power to an antenna used to provide data to a train passing the fixture location. Specifically, the disclosure relates to a signaling antenna powered by a light fixture power supply and battery backup systems.

2. Background Information

Large public facilities and public transportation systems use hundreds or thousands of light fixtures which often include battery backup systems for use during power outages. The light fixtures are disposed in the areas used by the public, areas used by operational personnel, and in the train tunnels and pathways used by transportation equipment. Some battery backup systems include self-test components which report battery test results to a remote location.

SUMMARY OF THE DISCLOSURE

In one configuration, the disclosure provides a light fixture with a sensor port that allows a sensor to be connected to the light fixture. The connection provides power to the sensor. The connection also provides a communications link between the sensor and the light fixture which allows data generated by the sensor to be communicated from the light fixture to a remote location with the communications devices used by the light fixture to report battery test results.

In another configuration, either the light fixture or the sensor unit includes a power outlet that is used to provide power to an antenna used for train signaling. The antenna can provide to the train a location marker associated with the location of the antenna. In additional configurations, the antenna provides to the train other data communicated to the light fixture through the light fixture communication system. The antenna can be an ultra-wideband antenna. The power supply for the light fixture is used to power the antenna. The power supplied can be the low-voltage direct current electrical power supplied to the light emitting diodes. In addition, the battery backup for the light fixture also provides emergency battery backup power to the antenna. An M12 power connector is provided to supply the antenna with power.

In a further configuration, a fixture is provided with an antenna with power supply and battery backup without any lighting devices. In this configuration, the sensor and/or antenna are powered by a power supply and a battery backup system without lighting functions. The assembly can include the communications system for the battery self-test and the sensor.

These fixtures can be used together to define a network. Each fixture is identified with a unique identifier which allows its location to be identified. The sensor can be provided to generate data related to one or more of temperature, humidity, carbon monoxide concentration, carbon dioxide concentration, other gas concentrations, ozone, smoke, radiation, preselected airborne chemicals, motion, speed, sound, and/or vibration. The data generated by the sensor can be transmitted to a remote location through the same communications protocols as used to report the battery self-test data. The antenna provides location data to a receiver or transponder disposed on a train or other device in a location near the fixture.

In another configuration, the disclosure provides a light fixture having an auxiliary power port that allows a sensor to be powered from the light fixture. The sensor includes its own wireless communications equipment that reports data from the sensor to a remote location. This light fixture or sensor can have a second power outlet to power an antenna used for train signaling data.

The configurations of the light fixtures described herein may be used in public facilities and public transportation systems and, in particular, within underground train tunnels.

In an exemplary configuration, the disclosure provides a fixture that includes an integrated battery backup with a self-reporting battery test. The self-test data is reported to a remote computer through a wireless communications protocol. A sensor is in communication with the fixture and its data is also communicated to the remote computer through the same wireless communications protocol. Data can be delivered to the manager of the facility, to the authority having jurisdiction over the tests, to a remote computer, or to a website through an Ethernet cable, a Power Line Communication protocol, or any of a variety of wireless communications protocols including 418/900 MHz Mesh Network, WIFI or ZigBee. A RuBee (IEEE standard 1902.1) communications protocol may be used for the relatively harsh environments faced by wireless communications systems in underground transportation facilities. In order to communicate the data, each fixture can include a communications device that provides for the desired communications. For example, each fixture can include a network repeater, a Wifi chip, a ZigBee chip, or a RuBee transceiver. The remote computer can be a computer located in the same facility as the light fixture providing the reporting or a computer located in a location remote from the facility. The data may be available through the Internet through a web server. The data communicated to the remote location may include the data from the sensor, the sensor identifier, information about malfunctions, battery levels, lumen output of LEDs, status of power supply, the identification of which power source is being used, and the physical location of the item having a malfunction so that it can be repaired. A service message can be generated and communicated by text, email, phone, or other communications methods to service personnel.

In one example related to public transportation, computers located in terminals receive data from the fixtures disposed in the tunnels between the terminals. These terminal computers provide the data gathered from the fixtures to a remote central computer.

BRIEF DESCRIPTION OF THE DRAWINGS

Similar numbers refer to similar parts throughout the specification.

DETAILED DESCRIPTION OF THE DISCLOSURE

Figure 1:
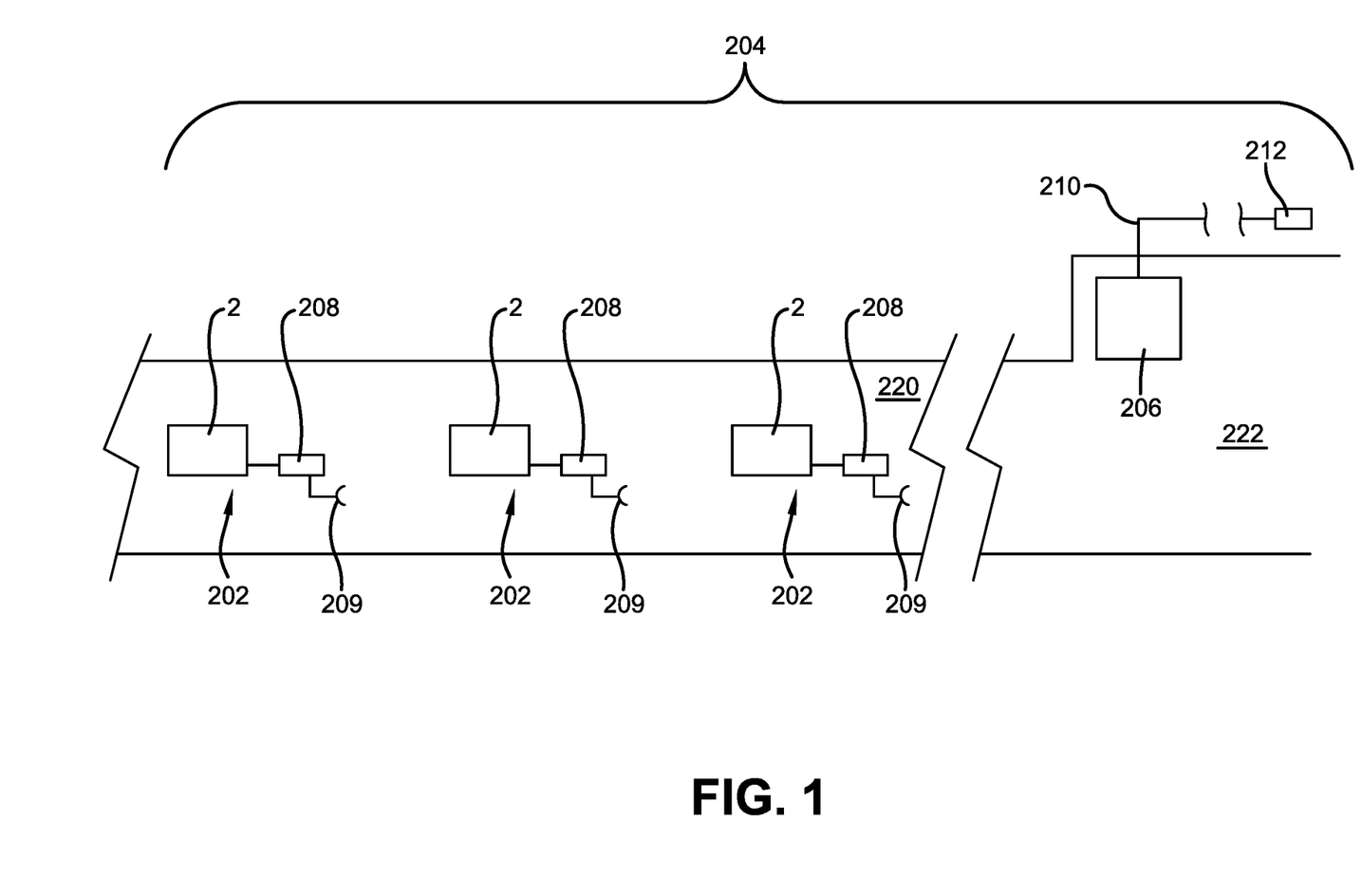
FIG. 1 is a schematic view of an exemplary network of fixtures with signaling devices with a terminal computer depicted to receive data from the plurality of fixtures.

FIG. 1 is a schematic view of a plurality of fixture assemblies 202 arranged in a network 204. Fixture assemblies can be located periodically along a train tunnel such as every two hundred feet. Each assembly 202 sends data to a remote computer 206 that can store the data, process the data, and/or send it on to another computer 212 for other uses. The communication with the other computer can be direct through a cable 210 or wireless communication or indirectly through the internet. An exemplary fixture assembly 202 includes a light fixture 2 in combination with a sensor 208 and/or a signaling device 209. Sensor 208 and/or signaling device 209 are powered by the power supplied by assembly 202 which is typically used to power lights. Sensor 208 is a device that creates data in digital form in response to a condition for which it is configured to monitor. Sensor 208 can generate data related to one or more conditions such as temperature, humidity, carbon monoxide concentration, carbon dioxide concentration, other gas concentrations, ozone, smoke, radiation, preselected airborne chemicals, motion, speed, sound, and/or vibration. Signaling device 209 is an antenna such as an ultra-wideband antenna capable of communicating data such as a location identifier to a train receiver or transponder.

In the exemplary configuration of FIG. 1, network 204 is arranged in public transportation facility with a plurality of assemblies 202 disposed in a train tunnel 220 and terminal computer 206 disposed at a terminal 222. A terminal computer 206 can be on each end of tunnel 220 and can gather redundant data.

Figure 2:
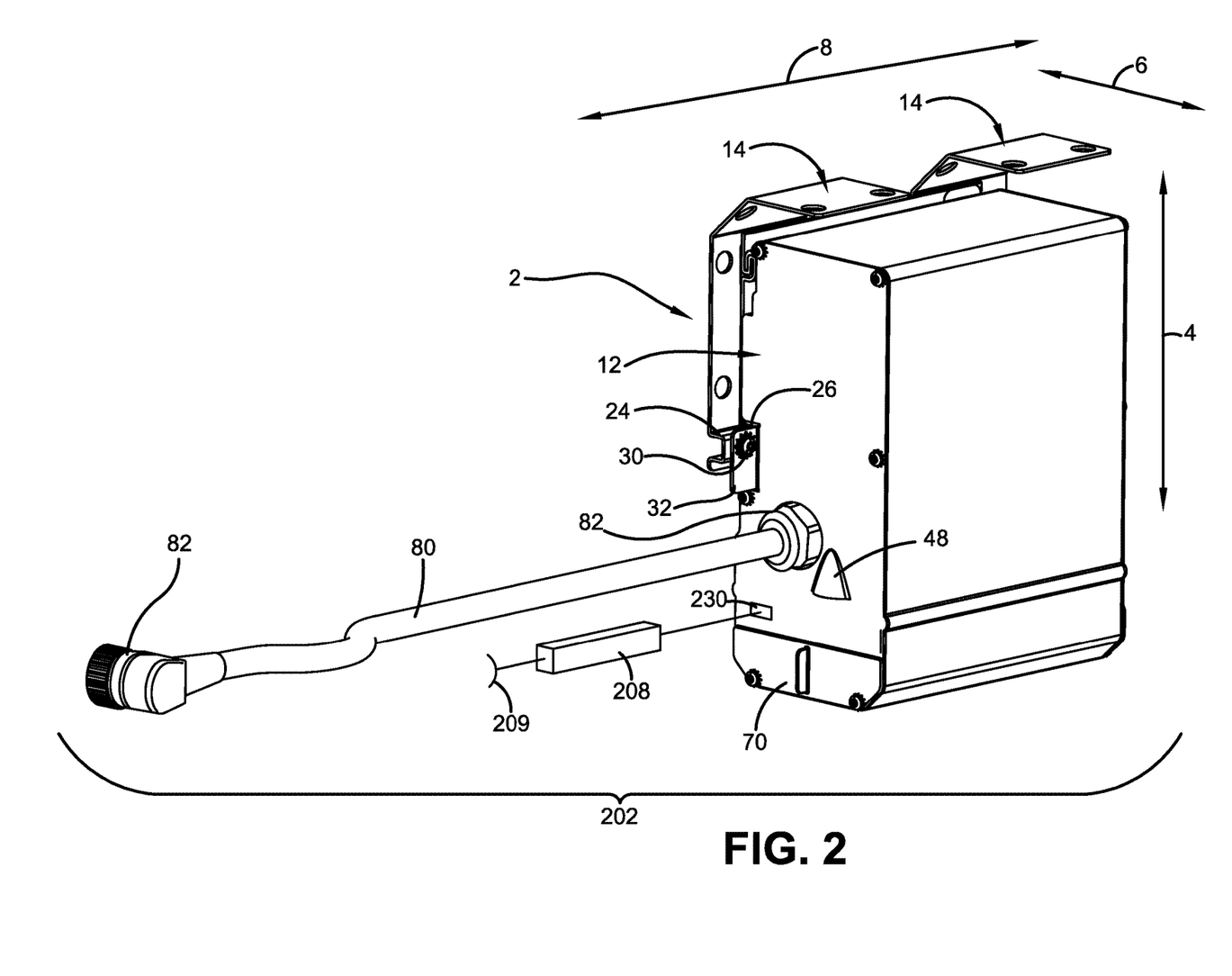
FIG. 2 is a front perspective view of an exemplary light fixture and sensor assembly with a signaling device.
Figure 3:
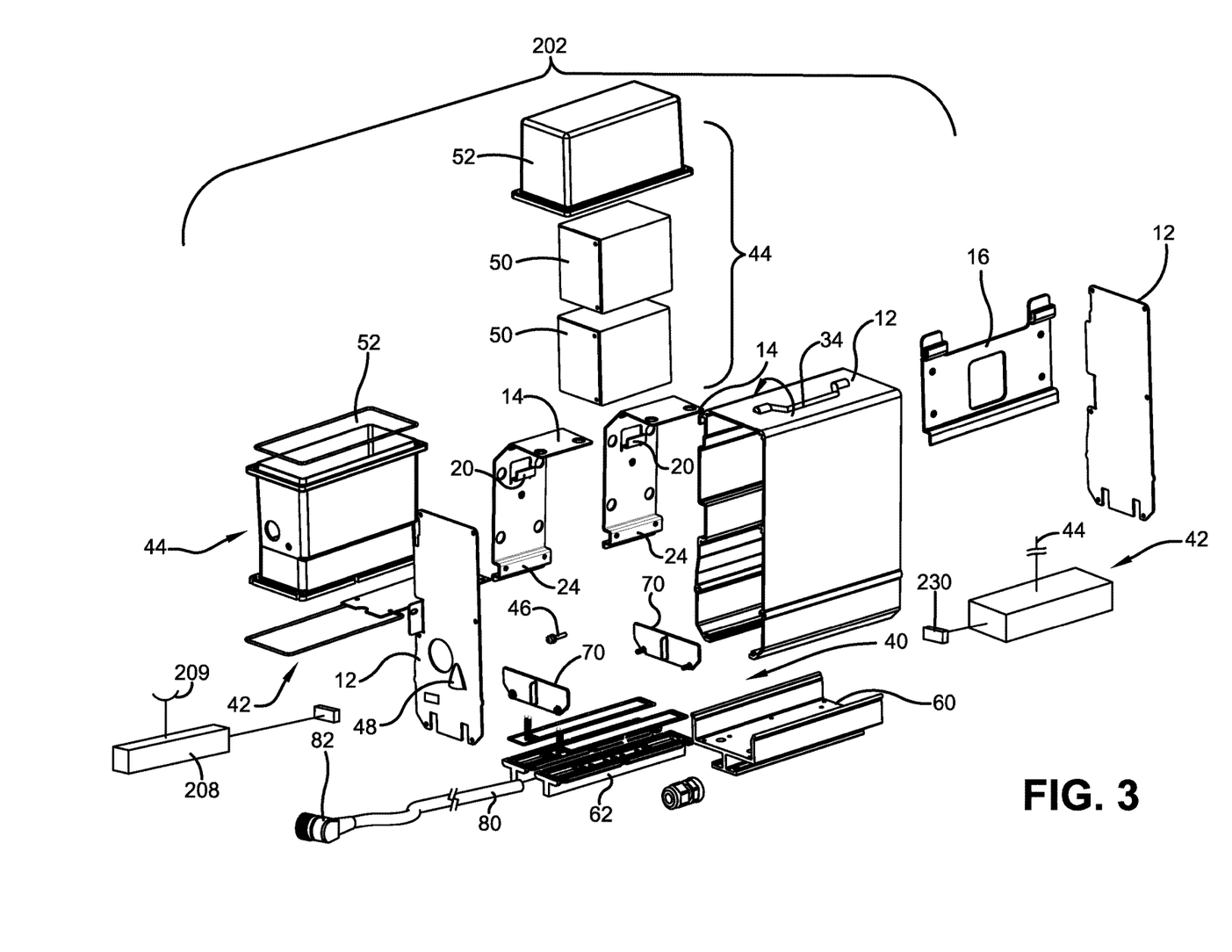
FIG. 3 is an exploded view of a light fixture and sensor assembly with the signaling device.

An exemplary assembly 202 depicted in FIGS. 2 and 3. This exemplary assembly 202 includes lighting features. Light fixture 2 can be used in subway tunnels to light the track bed for the train operators and to provide light for maintenance workers. Light fixture 2 can also be used in other indoor or outdoor architectural applications where a battery backup system for the lighting is desired. Light fixture 2 fits within the depth of existing New York Subway tunnel light and bracket combinations to allow for retrofitting. In addition, light fixture 2 substantially fits within the three dimensional perimeter of existing light units while including a battery backup system within the same perimeter which was not achieved by the existing light and bracket systems which use remote battery backup equipment. Light fixture 2 (not including the power supply cord) has an installed height (dimension line 4 in FIG. 2) of less than 11.5 inches, a depth (dimension line 6 in FIG. 2) of less than 4.5 inches, and a length (dimension line 8 in FIG. 2) of less than 12 inches (and less than 9.5 inches in one configuration). The 4.5 inch depth limitation and the 11.5 inch height limitation are more important to the retrofitting than the length dimension.

Light fixture 2 generally includes a light and battery unit disposed in a housing 12 that is selectively mountable to and removable from a bracket system. Bracket system includes at least one bracket 14 and may include a plurality of spaced brackets 14. A spacer 16 can be used to prevent housing 12 from contacting bracket 14. When used in subway tunnels, brackets 14 are directly connected to concrete walls with suitable anchors (concrete screws, nails, or other masonry connectors). Bracket 14 is made from stainless steel. In some configurations, housing 12 is made from aluminum. Direct contact between stainless steel and aluminum is undesirable especially in hot humid environments because of galvanic corrosion. In these conditions, spacer 16 prevents direct contact between the two metals while also providing a shock absorber to housing 12 against the repeated vibration forces to which system 2 is subjected.

Spacer 16 is made from an insulating material such as a polymer, a rubber, fiberglass, PVC, coated aluminum, or other insulating material. Spacer 16 can be resilient to help secure housing 12 and to act as a shock absorber. Spacer 16 can be secured to brackets 14 with fasteners such as screws or rivets. Spacer 16 wraps closely around the hooks 20 of brackets 14 to maintain the separation of brackets 14 from housing 12 and to dampen vibrations. Each bracket 14 also defines a shelf 24 and spacer 16 covers shelf 24 with a shelf cover 25 so that a ledge 26 defined by housing 12 rests on shelf 24 such that housing 12 is supported without the need to manipulate fasteners before housing 12 is supported.

Lateral fasteners 30 can be installed through tabs 32 that extend from housing 12 to secure housing 12 to brackets 14. Tabs 32 are spaced from brackets 14 as shown in FIG. 1 to prevent direct contact. Spacer 16 can include ears that extend between tabs 32 and brackets 14 to prevent direct contact. Fasteners 30 limit lengthwise movement of housing 12 with respect to brackets 14 and spacer 16. These fasteners 30 can be installed after housing 12 is fully supported by hooks 20 and shelf 24.

Light fixture 2 thus makes it easy for a maintenance worker to remove a non-functioning light and battery unit and replace it with a new unit. The quick mount system allows an old unit to be removed from brackets 14 with one hand while a new unit can be installed with the other hand. An optional handle 34 allows the person replacing the units to carry one or more of the units with one hand. Handle 34 is movable between extended and storage positions. The storage position of handle 34 is within the perimeter dimensions described above. The extended position provides an opening for the insertion of the hand or fingers of the person carrying the light. Handle 34 also allows a plurality of lights to be hung on a carrier. The installation process is thus easy, can be accomplished by a single worker, and, when fasteners 30 are used, only requires a simple screwdriver. (Connector 82 described below also allows this process to be easy.)

In general, the materials used for the major components of system 2 are low-smoke zero halogen and suitable for high humidity high and low temperature environments. Visible features have a matte finish.

Housing 12 carries the light engine 40, the power supply 42 for light engine 40, and a battery backup system 44 for light engine 40. Power supply 42 provides power for sensor 208 and/or antenna 209. The power can be low voltage, direct current electrical power. In other configurations, battery backup system 44 can be located remote from housing 12. Light engine 40 includes a plurality of light emitting diode (LED) light sources that are configured to last about five years making replacement of the entire housing 12 including the replacement of battery backup system 44 reasonable. Battery backup system 44 is designed to supply power to light engine 40, sensor 208, and/or antenna 209 for four hours. System 44 can also supply the power to just sensor 208 and/or antenna 209 when lighting features are not used. System 44 automatic switches to emergency mode when power fails and returns to charge mode when power returns. System 44 thus includes batteries, a battery charger, and a transfer switch. System 44 also performs automatic self-testing wherein system 44 simulates AC power failure, conducts a discharge test to monitor battery voltage and discharge current and, when the test is complete, returns to charge mode. This test performed for 30 sec each month, and four hours each year. The results of the tests can be stored locally or delivered to a remote location through a wired connection or through a wireless communications protocol. Each unit can have its own unique identifier associated with the location of the light unit. System 44 thus includes a battery self-check circuit and a communications module that sends data generated from the self-check circuit.

System 44 can include an indicator light 46 that can be an LED indicator which provides a solid signal indicator while line voltage (such as 120 VAC, 277 VAC, or other) is present, turns off is off during power outage, and blinks if automatic testing detects failure. Light 46 is shielded by a shield 48 to prevent train operators from seeing indicator light 46. In subway tunnel applications, indicator light 46 is not intended to be viewed from a moving train. When used, light 46 is viewed by maintenance workers walking the tracks. In these applications, system 44 can turn off the entire light unit when the self-test operation detects a failure in the battery system. A light unit that is completely off is readily noticed by a train driver and a service call can be arranged. A switch is provided that cuts power to the light engine when the self-check circuit identifies a problem with the batteries. This switch or another switch can be configured to prevent battery backup system 44 from powering the lights when the unit is not installed. This allows the units to be stored within housing 12 in a condition ready for use without discharging batteries.

Power supply 42 operates with an operating input voltage of 277 VAC±10% @ 60 Hz. Other power input voltages are possible. Power supply 42 outputs a low voltage direct current to light engines 40 suitable for the LED light engines. Power supply 42 or the input line voltage supplies the power needed to charge the batteries of system 44 and to run the self-check features of battery system 44. Power supply 42 supplies the power needed for sensor 208 and/or antenna 209. Power supply 42 is disposed under the batteries and above light engine 40. Batteries 50 are disposed in a container 52 disposed within housing 12. Power supply 42 can be disposed above or within a top portion of a heat sink 60 which carries light engine 40 on its lower surface. FIG. 7 depicts alternate positions. Heat sink 60 is connected to the bottom of housing 12 using the channels defined by the interior of the front and rear walls of the enclosure. The lenses are disposed between the bottom of the heat sink 60 and the lower ends of the front and rear walls of the enclosure. Various seals and O-rings are used to seal the elements of system 2. The expected environmental conditions include relative humidity up to 100%; ambient temperature: −40° to 50° C.; steel dust in the air; significant vibration; and 24/7 operation.

Light engine 40 includes two rows of LED boards or strips disposed above lenses 62 designed to direct light downwardly from housing 12 onto the track bed. Optical Requirements: End of life—0.25 foot candles across tunnel floor (14 foot width, 6 to fourteen foot mounting height, 30 to 40 foot spacing on each side of tunnel with 15 to 20 foot stagger)—0.55 lumen maintenance factor; Reflectivity of all surfaces=0.1; Color temperature: 4000K max; CRI: 70 min. Light engine 40 is configured to at least match the light currently provided by the existing incandescent light bulbs if housing 12 are spaced the same. In one configuration, the light provided on the ground of the tunnel application is uniform both across and along the track and has no more than a 7:1 ratio between the maximum lit areas and the minimum lit areas.

Some light is directed through the ends of lenses 62. This light cannot shine in the direction of an oncoming train so housing 12 includes removable shades 70 that, when connected to housing 12, cover the ends of lenses 62. The selective use of shades 70 allows each enclosure to be configured in four different configurations—both ends covered, both ends uncovered, only left end covered, and only right end covered. Also, shades may be transparent and colored to provide indication of location within a tunnel. For example, shade 70 can be a blue plastic that indicates a telephone location or an emergency exit location.

Power is provided through a power supply cord 80 that has a quick connect and quick disconnect connector 82. Connector 82 is used with a junction box having the line voltage and a corresponding connector. The insulation on the power supply cord is a low smoke zero halogen (LSZH) material. In another configuration, power supply cord 80 extends from the junction box with connector 82 disposed at the end of the cord that is connected to housing 12. Housing 12 supports the corresponding connector to allow power to be readily connected after the unit is replaced. This configuration allows the unit to be replaced without replacing power supply cord 80.

Sensor 208 can be directly wired with light fixture 2 to provide power and data communications. In one example that allows sensors 208 to be optionally connected, sensor 208 is connected to light fixture 2 through a port 230 which supplies power to sensor 208 and allows data to be communicated from sensor 208 to light fixture 2 where it is communicated to a remote computer (such as terminal computer 206) with the battery self-test data or through the same communications protocols. Port 230 can be a powered USB port. This configuration allows sensors to be added and removed as needed. This also allows different or updated sensors to be added to light fixtures 2.

Either fixture 2 or sensor 208 can include a power outlet for antenna 209. The power outlet can be an M12 connector. In the exemplary configurations, antenna 209 is powered from sensor 208 but antenna 209 can be powered directly from fixture 2. In these exemplary embodiments, fixture 2 include lighting features. In other configurations, the lighting features can be eliminated such that fixture 2 includes power for sensor 208 and/or antenna 209 without also powering lighting.

The data from light fixture 2 can be delivered to terminal computer 206 or to the manager of the facility, to the authority having jurisdiction over the lighting tests, to a remote computer, or to a website through an Ethernet cable, a Power Line Communication protocol, or any of a variety of wireless communications protocols including 418/900 MHz Mesh Network, WIFI or ZigBee. A RuBee (IEEE standard 1902.1) communications protocol may be used for the relatively harsh environments faced by wireless communications systems in underground transportation facilities. In order to communicate the data, each fixture can include a communications device that provides for the desired communications. For example, each fixture can include a network repeater, a Wifi chip, a ZigBee chip, or a RuBee transceiver. The remote computer can be a computer located in the same facility as the light fixture providing the reporting or a computer located in a location remote from the facility. The data may be available through the Internet through a web server. The data communicated to the remote location may include the data from the sensor, the sensor identifier, information about malfunctions, battery levels, lumen output of LEDs, status of power supply, the identification of which power source is being used, and the physical location of the item having a malfunction so that it can be repaired. A service message can be generated and communicated by text, email, phone, or other communications methods to service personnel.

Figure 4:
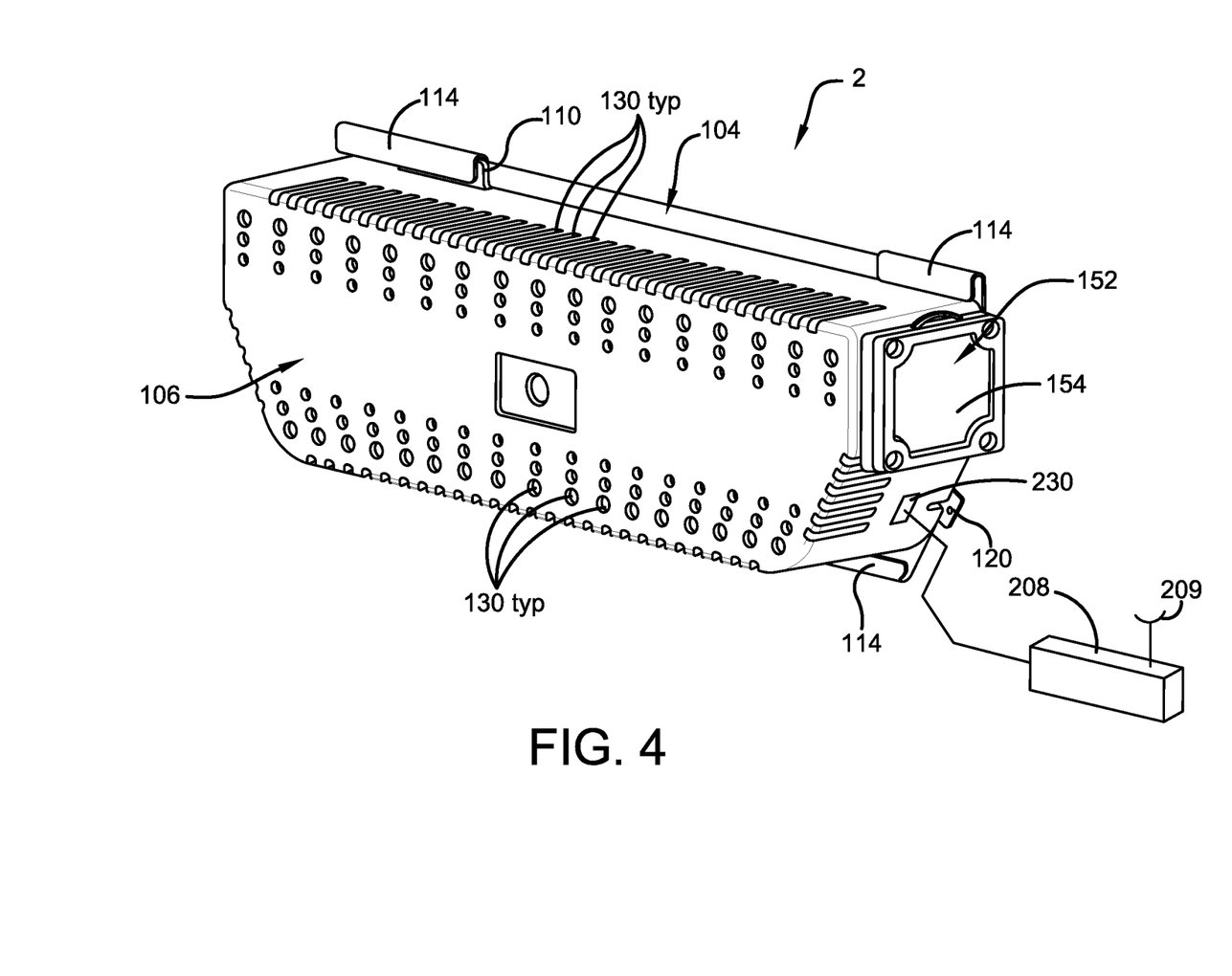
FIG. 4 is a perspective view of another exemplary light fixture and sensor assembly with a signaling device.

FIG. 4 depicts another exemplary light fixture 2 that can be optionally combined with sensor 208 and/or antenna 209 to define assembly 202.

In the foregoing description, certain terms have been used for brevity, clearness, and understanding. No unnecessary limitations are to be implied therefrom beyond the requirement of the prior art because such terms are used for descriptive purposes and are intended to be broadly construed. Moreover, the above description and attached illustrations are an example and the invention is not limited to the exact details shown or described. Throughout the description and claims of this specification the words "comprise" and "include" as well as variations of those words, such as "comprises," "includes," "comprising," and "including" are not intended to exclude additives, components, integers, or steps.

The invention claimed is:

1. A light fixture assembly for use in a public transportation train system; the light fixture assembly comprising:
a housing;
a light carried by the housing;
a power supply for the light; the power supply being located at the housing;
a battery backup system adapted to power the light during a power failure; the battery backup system being located at the housing; the battery backup system having a self-testing and reporting system that includes a communications device that transmits information related to the self-testing and reporting system to a remote location;
a sensor port;
a sensor that generates data in response to a condition; the sensor being connected to and powered from the sensor port;
the generated data from the sensor being transmitted to the remote location by the communications device of the self-testing and reporting system;
a signaling antenna powered by the power supply; the signaling antenna communicating a location marker with trains of the public transportation train system;
the location marker being associated with location of the signaling antenna within the public transportation system; and
the battery backup system adapted to power the sensor and the signaling antenna during the power failure.

2. The light fixture assembly of claim 1, wherein the sensor generates data related to one or more conditions that include temperature, humidity, carbon monoxide concentration, carbon dioxide concentration, other gas concentrations, ozone, smoke, radiation, preselected airborne chemicals, motion, speed, sound, and vibration.

3. The light fixture assembly of claim 1, wherein the sensor has an identifier.

4. The light fixture assembly of claim 3, wherein the light fixture has an identifier; the identifier of the sensor being the same as the identifier of the light fixture.

5. A light fixture assembly comprising:
a housing;
a light carried by the housing;
a power supply for the light; the power supply being carried by the housing;
a battery backup system carried by the housing; the battery backup system adapted to power the light during a power failure; the battery backup system having a self-testing and reporting system that includes a communications device that transmits information related to the self-testing and reporting system to a remote location;
a sensor port located at the housing;
a sensor that generates data in response to a condition; the sensor being removably and replaceably connected to and powered from the sensor port;
the generated data from the sensor being transmitted to the remote location by the communications device of the self-testing and reporting system;
an ultra-wideband train signaling antenna powered by the power supply; the ultra-wideband train signaling antenna adapted to communicate a location marker with trains of a public transportation train system; the location marker being associated with location of the signaling antenna within the public transportation system; and
the battery backup system adapted to power the sensor and the ultra-wideband train signaling antenna during the power failure.

6. The light fixture assembly of claim 5, wherein the sensor generates data related to one or more conditions that include temperature, humidity, carbon monoxide concentration, carbon dioxide concentration, other gas concentrations, ozone, smoke, radiation, preselected airborne chemicals, motion, speed, sound, and vibration.

7. The light fixture assembly of claim 5, wherein the sensor has an identifier.

8. The light fixture assembly of claim 7, wherein the light fixture has an identifier; the identifier of the sensor being the same as the identifier of the light fixture.

9. A light fixture assembly comprising:
a housing;
a light carried by the housing;
a power supply for the light; the power supply being located at the housing;
a battery backup system carried by the housing; the battery backup system adapted to power the light during a power failure; the battery backup system having a self-testing and reporting system that includes a communications device that transmits information related to the self-testing and reporting system to a remote location;
a sensor that generates data in response to a condition;
the generated data from the sensor being transmitted to the remote location by the communications device of the self-testing and reporting system;
a train signaling antenna powered by the power supply; the train signaling antenna adapted to communicate a location marker with trains of a public transportation train system; the location marker being associated with location of the signaling antenna within the public transportation system; and
the battery backup system adapted to power the sensor and the train signaling antenna during the power failure.

10. The light fixture assembly of claim 9, wherein the sensor generates data related to one or more conditions that include temperature, humidity, carbon monoxide concentration, carbon dioxide concentration, other gas concentrations, ozone, smoke, radiation, preselected airborne chemicals, motion, speed, sound, and vibration.

11. The light fixture assembly of claim 9, wherein the sensor has an identifier.

12. The light fixture assembly of claim 11, wherein the light fixture has an identifier; the identifier of the sensor being the same as the identifier of the light fixture.

13. The light fixture assembly of claim 9, wherein the communications device of the self-testing and reporting system combines the data from the sensor with the information related to the self-testing and reporting system.

* * * * *